United States Patent [19]
Huang et al.

[11] Patent Number: 5,378,646
[45] Date of Patent: Jan. 3, 1995

[54] PROCESS FOR PRODUCING CLOSELY SPACED CONDUCTIVE LINES FOR INTEGRATED CIRCUITS

[75] Inventors: Heng-Sheng Huang, Taipei; Kun-Luh Chen, Chu-Nan; Wood Wu, Hsin-chu, all of Taiwan, Prov. of China

[73] Assignee: United Microelectronics Corporation, Hsinchu, Taiwan, Prov. of China

[21] Appl. No.: 271,756

[22] Filed: Jul. 7, 1994

[51] Int. Cl.[6] .......................................... H01L 21/265
[52] U.S. Cl. .......................................... 437/47; 437/52; 437/193; 437/195; 437/48
[58] Field of Search .................. 437/47, 48, 51, 52, 437/193, 195, 49

[56] References Cited

U.S. PATENT DOCUMENTS

| | | | |
|---|---|---|---|
| 4,502,914 | 3/1985 | Trumpp et al. | 156/643 |
| 4,839,305 | 6/1989 | Brighton | 437/41 |
| 5,126,290 | 6/1992 | Lowrey et al. | 437/48 |
| 5,236,853 | 8/1993 | Hsue | 437/43 |
| 5,264,386 | 11/1993 | Yang | 437/48 |
| 5,290,723 | 3/1994 | Tani et al. | 437/52 |
| 5,306,657 | 4/1994 | Yang | 437/52 |
| 5,318,921 | 6/1994 | Hsue et al. | 437/48 |

*Primary Examiner*—Brian E. Hearn
*Assistant Examiner*—Tuan Nguyen
*Attorney, Agent, or Firm*—George O. Saile; Wolmar J. Stoffel

[57] ABSTRACT

A process of fabricating a non-volatile read only memory device (ROM) wherein the conductive word lines have desirable very narrow widths and are closely spaced. The invention provides a process for forming word lines with a smaller width and line pitch than is possible with conventional processes. A first set of word lines is formed. Next, a second set of word lines is formed in between the first word lines using oxide spacers to define the second word lines.

20 Claims, 2 Drawing Sheets

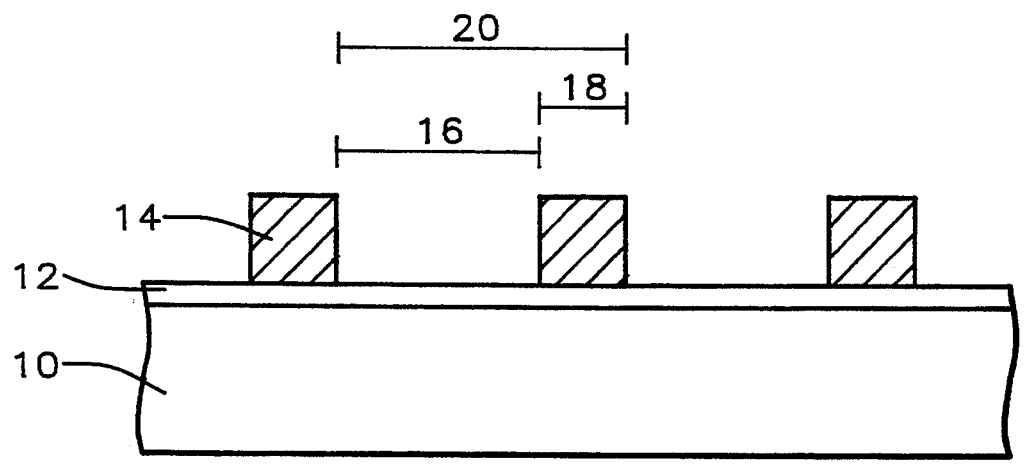
FIG. 1 — Prior Art
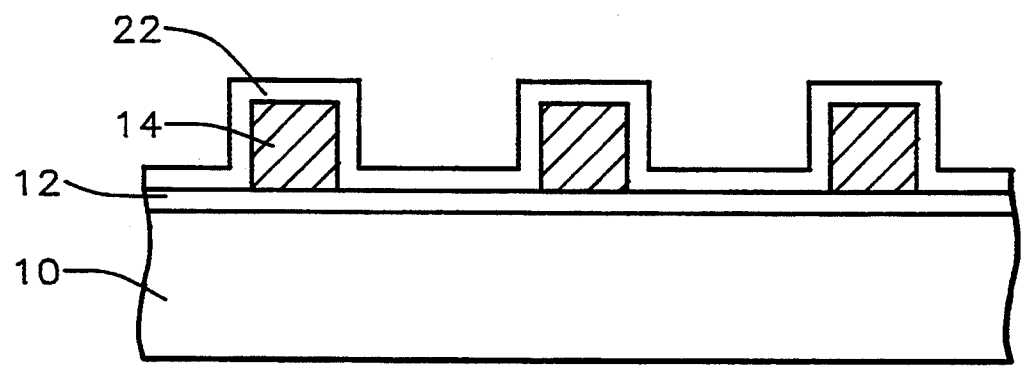
FIG. 2
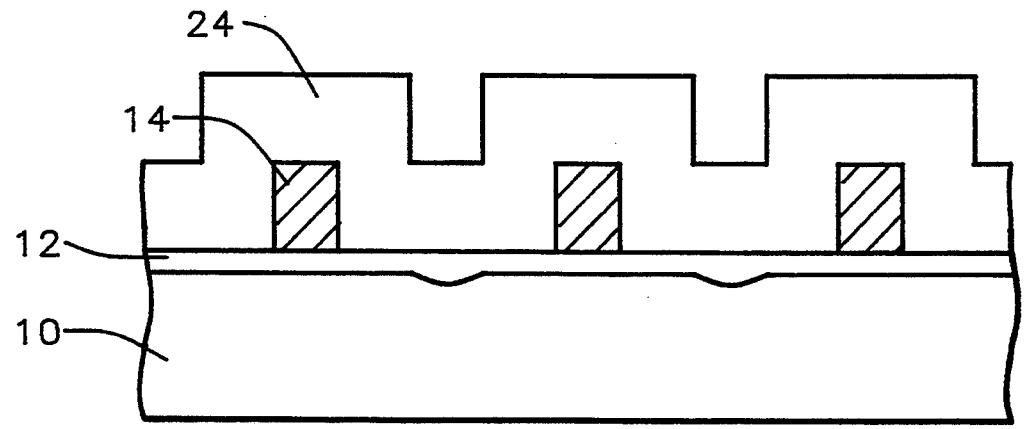
FIG. 3

PROCESS FOR PRODUCING CLOSELY SPACED CONDUCTIVE LINES FOR INTEGRATED CIRCUITS

BACKGROUND OF THE INVENTION (1) Field of the Invention

This invention relates to a read only memory (ROM) type semiconductor device and in particular, to an improved process for forming high density self aligned conductive lines (word lines).

(2) Description of the Prior Art

In the quest to achieve microminiaturization of integrated circuit devices, individual elements have been made very small and the elements have been closely packed. As ROM devices are scaled down in dimension, there is a continuous challenge to produce high density conductive lines (i.e., word lines) using a minimum number of process steps. In conventional methods for forming conductive lines, the minimum line pitch is limited by the photolithography precision. The line pitch is the distance between on side of a line and the same side of an adjacent line. This shown in FIG. 1 where pitch 20 illustrates the word line pitch. This minimum line pitch 20 limits the miniaturization of the ROM.

In the conventional prior art process, a thin insulating layer 12, typically oxide is deposited on a monocrystalline silicon substrate 10 as shown in FIG. 1. Subsequently, a conductive layer, often composed of polycrystalline silicon, is deposited on the insulating layer. Next, a photoresist layer is formed on the conductive layer. The photoresist layer is exposed and developed to define a pattern of elongated spaced parallel lines. The exposed conductive layer is etched to form conducting lines 14 (i.e., word lines) and to expose portions of the first insulating layer. Finally, conventional semiconductor techniques are used to form arm complete the nonvolatile memory device.

SUMMARY OF THE INVENTION

An object of the present invention is to provide a process of forming a memory device with high density conductive lines.

Another object of the present invention is no provide a process for fabricating high density conductive lines with line pitches and line widths smaller than possible using a conventional process.

In accordance with the above objects, a process for fabricating high density conductive lines on a semiconductor substrate is provided. A thin insulating layer is formed on the surface of a monocrystalline semiconductor substrate. Next, a first blanket conductive layer, preferably polycrystalline silicon, is deposited over the first insulating layer. First conductive lines are formed from the conductive layer by using conventional photolithographic and etching processes.

Subsequently, a conformal polycrystalline silicon layer is formed over the first conductive lines and the exposed portions of the insulation layer. The conformal polycrystalline silicon layer is completely oxidized to form a conformal silicon oxide layer. Then, the conformal silicon oxide layer is anisotropically etched to form silicon oxide spacers on the vertical sidewalls of the conductive lines and to expose the tops of the first conductive lines. Next, a thin oxide layer and a second polycrystalline silicon layer are grown on the exposed surfaces. The second polycrystalline silicon layer is anisotropically etched to form second conductive lines in the areas between the spacers. As a result of this process, the smallest line pitch achievable for the first and second conductive lines is approximately half of the line pitch for conductive lines formed using the prior art process.

BRIEF DESCRIPTION OF THE DRAWINGS

The drawings show the following:

FIG. 1 is cross-sectional view in broken section in greatly enlarged scale that illustrates a device structure in a stage of fabrication in accordance with the prior art processes FIGS. 2 through 6 are a sequence of cross-sectional views in broken section in greatly enlarged scale that illustrate a device structure in various stages of fabrication in accordance with the process of the invention.

DETAILED DESCRIPTION OF THE PREFERRED EMBODIMENTS

Figure 4:
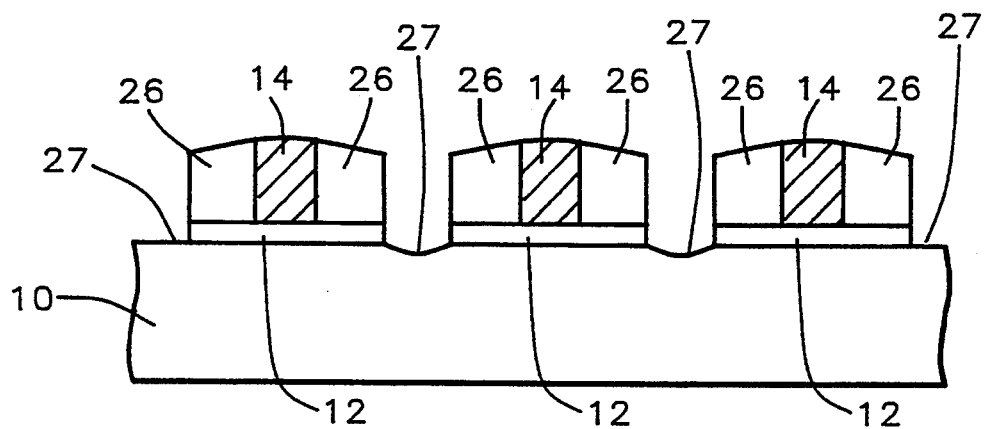

The present inventions will be described in detail with reference to the accompanying drawings. It should be noted that the drawings are in greatly simplified form. In practice the memory device structure will be one of many supported on a common substrate connected with suitable metallurgy in various electronic electric circuit configurations. The substrate shall be a monocrystalline silicon semiconductor body with many devices fabricated therein, as is well known in the art. The substrate 10 is preferably formed of monocrystalline silicon having a crystalline orientation of <1 0 0>. The background substrate dopant is preferably P-type, with a concentration in the range of 5E15 to 5E17 atoms/cm$^3$. As shown in FIG. 1, first thin insulating layer 12, preferably oxide, is formed on substrate 10. Layer 12 typically has a thickness is in the range of 100 to 200 Angstroms, more preferably a thickness of 130 Angstroms. Next, a first conductive blanket layer is formed over the first insulating layer 12.

The conductive blanket layer has a thickness in the range of 2000 to 4000 Angstroms, and more preferably a thickness of 3000 Angstroms. The conductive layer is preferably formed of polycrystalline silicon or a polycide. The first conductive layer can be doped using insitu doping or by ion implantation. Typically, Arsenic or Phosphorous ion impurities are used. Conductive layer impurity concentrations are in the range of 5E18 to 5E21 Atoms/cm$^3$, and more preferably 1E20 Atoms/cm$^3$.

Over the first conductive layer, a photoresist layer is formed, exposed and developed to define a pattern of elongated spaced parallel resist lines. This pattern is used as a etch mask and the exposed conductive layer is anisotropically etched to form first conductive lines 14, (i.e., word lines) with substantially vertical sidewalls. Also, the etching process exposes portions of the first insulating layer between the conductive lines. Preferably, the conductive layer is etched by a commercially available plasma dry etcher with significantly high polysilicon to silicon oxide selectivity and preferably higher than 20 to 1. The first conductive lines 14 have a line pitch in range of 0.8 to 1.6 microns, and more typically a line pitch of 1.2 microns for a 0.6 micron feature size process.

Referring to FIG. 2, The photoresist is then removed. Subsequently, a conformal polycrystalline silicon layer 22 is formed over the conductive lines 14 and the exposed portion of the first insulating layer 12. The conformal layer 22 has a thickness in the range of 500 to 2000 Angstroms, and a thickness more preferably of 1000 Angstroms.

Subsequently, polysilicon conformal layer 22 is completely oxidized to form a conformal silicon oxide layer 24 as illustrated in FIG. 3. Layer 24 has a thickness in the range of 2000 to 4000 Angstroms, and more preferably a thickness of 3000 Angstroms. Portions of polycrystalline silicon conductive line 14 can be consumed in the oxidation process. Also, portions of the substrate between the first conductive lines 14 can also be consumed in the oxidation process. Normally, the ratio of the thickness of polycrystalline silicon consumed to oxide thickness grown is approximately 45 percent.

Figure 5:
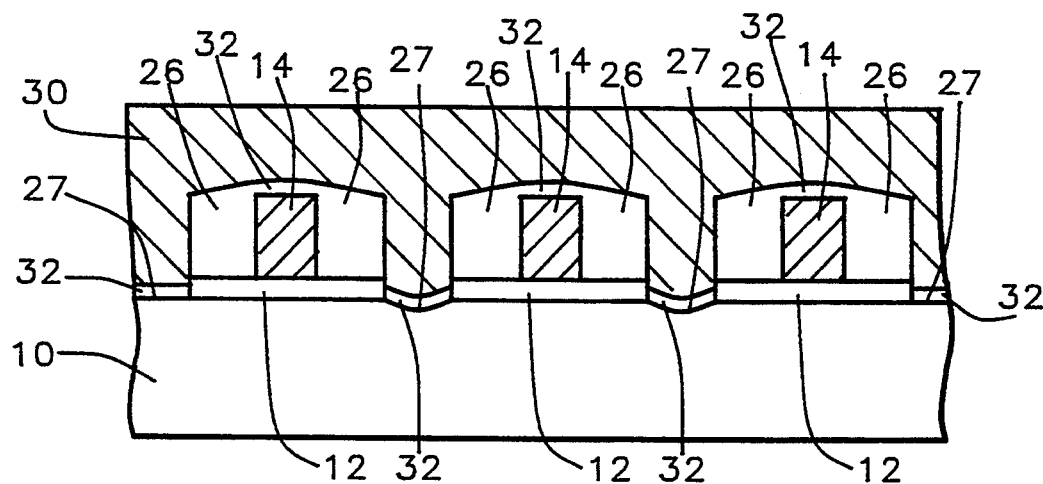

As shown in FIG. 4, the oxide layer 24 is anisotropically etched to expose the top surfaces of the conductive lines 14 forming silicon oxide spacers 26 having vertical sidewalls. Preferably the oxide layer 24 is removed by anisotropic reactive ion etching with $CHF_3$ and oxygen as the etching ambient. The spacers 26 have a width in the range of 1150 to 4000 Angstroms. Also, areas 27 of the substrate between the spacers 26 are exposed by the etch. Next, the exposed substrate areas 27 and conductive lines 14 are oxidized to form a second thin insulating layer 32 as shown in FIG. 5. The thin insulating layer 32 has a thickness in the range of 100 to 200 Angstroms, and more preferably with a thickness of 130 Angstroms.

Next, as illustrated in FIG. 5, a second polycrystalline silicon layer 30 having a substantially planar top surface is deposited on the substrate so that the lines 14 and oxide layer 32 are covered. The second polycrystalline silicon layer 30 has a thickness in the range of 2000 to 5000 Angstroms (measured from the top of oxide layer 32 to the top of polysilicon layer 30), and more typically has a thickness of 3000 Angstroms. The second polycrystalline layer 30 can be doped using insitu doping, diffusion or by ion implantation. Typically ion impurities that can be used are Arsenic or Phosphorous. Moreover, layer 30 is has an impurity concentration in the range of 5E18 to 5E21 atoms/$cm^3$.

Now, the second polycrystalline silicon layer 30 is anisotropically etched to a depth below the surface of layer 32 above the first conductive lines 14. This etch also forms the second conductive lines 34 in the areas 27 between the spacers 26.

Figure 6:
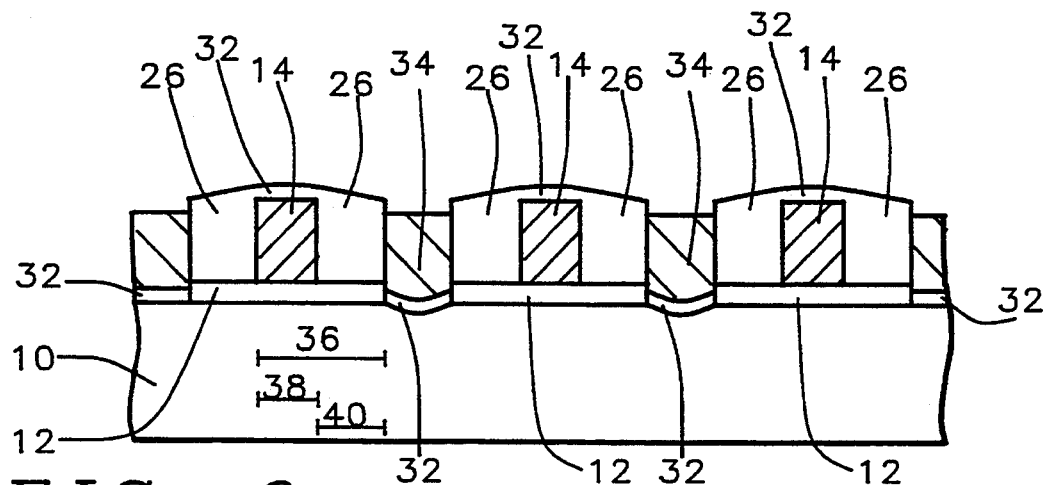

The invention provides a method for forming conductive lines that are nearly twice as density as compared to lines formed using the conventional process as shown FIG. 1, using the same photolithography ground rules. For example, for a 0.6 micron ground rule photolithography technology, the smallest feature definable is a 0.6 micron width or length. Therefore, as shown in FIG. 1, the minimum line pitch 20 would be 1.2 microns (i.e., 0.6 microns for line width 18 and 0.6 microns 16 for space). Using the invention and the same 0.6 micron photolithographic ground rule, as shown in FIG. 6, the minimum line pitch 36 is 0.6 microns, (i.e., 0.3 microns for the line width 38 and 0.3 microns for the space 40). First conductive line 14 and therefore, line width 38 are reduced by the oxidation that formed the spacers 26 which can consume a portion of the first conductive line 14. Also, the space width 40 is controlled by the oxidation process as opposed to the conventional process where space width 26 is controlled by less precise photolithographic processes. In the invention, oxidation processes which are used to form conductive lines and spacers, are much more controllable than photolithographic processes thus allowing smaller device dimensions. Overall, the invention achieves line pitches approximately half of that possible using the conventional process.

While the invention has been particularly shown and described with reference to the preferred embodiments thereof, it will be understood by those skilled in the are that various changes in form and details may be made without departing from the spirit and scope of the invention.

What is claimed is:

1. A method of forming a plurality of closely spaced word lines on the top surface of a semiconductor substrate, comprising the steps of:

providing a first thin insulating layer on the surface the semiconductor substrate, depositing a first conductive polysilicon blanket layer over the first insulating layer, depositing a photoresist layer over the first conductive polysilicon blanket layer, exposing, developing and etching the photoresist layer to form a pattern of elongated spaced parallel resist lines, anisotrophically etching the first conductive layer, using the photoresist pattern as a mask, to form first spaced conductive polysilicon lines with substantially vertical sidewalls and exposing portions of the first insulating layer, removing the photoresist layer, depositing a thin conformal polysilicon layer over the first conductive lines and over the exposed portions first insulating layer, completely oxidizing the thin conformal polysilicon layer and portions of the first conductive polysilicon lines to form a conformal silicon oxide layer over the first conductive polysilicon lines, anisotrophically etching the conformal silicon oxide layer exposing the top surfaces of the first conductive lines and forming spacers having vertical sidewalls, on the vertical sidewalls of the first conductive lines and exposing areas of the substrate between the spacers, oxidizing the exposed top surfaces of the first conductive lines and the exposed areas of the substrate between the spacers to form a second thin insulating layer, depositing a second conductive polysilicon layer having a substantially planar top surface on the substrate over the first conductive lines having a thickness in excess of the first conductive lines measured from the substrate surface, and anisotrophically etching the second polycrystalline silicon layer to a depth below the top of the second insulating layer thereby forming second conductive lines.

2. The method of claim 1 wherein said first thin insulating layer is formed of silicon oxide having a thickness in the range of 80 to 200 Angstroms.

3. The method of claim 1 wherein said first conductive polysilicon blanket layer has a thickness in the range of 2000 to 4000 Angstroms.

4. The method of claim 1 wherein said first conductive blanket layer is doped Arsenic or Phosphorous impurity ions in a concentration in the range of 5E18 to 5E21 Atoms/$cm^3$.

5. The method of claim 1 wherein said first conductive polysilicon lines have an initial width in the range of 0.4 to 0.8 microns, and an initial pitch in the range of 0.8 to 0.16 microns.

6. The method of claim 1 wherein the thin conformal polycrystalline silicon layer has a thickness in the range of 500 to 2000 Angstroms.

7. The method of claim 1 wherein the conformal silicon oxide layer has a thickness in the range of 2000 to 4000 Angstroms.

8. The method of claim 1 wherein the spacers have a width in the range of 1000 to 4000 Angstroms.

9. The method of claim 1 wherein the second thin insulating layer has a thickness in the range of 80 to 200 Angstroms.

10. The method of claim 1 wherein said second conductive blanket layer is doped with Arsenic or Phosphorous impurity ions in a concentration in the range of 5E18 to 5E21 Atoms/cm$^3$.

11. A method of forming a device having a plurality of closely spaced polysilicon lines on the surface of a semiconductor substrate, comprising the steps of:

provided a first insulating layer on the surface the semiconductor substrate, forming a plurality of first spaced polysilicon lines with substantially vertical sidewalls on the first insulating layer, oxidizing portions of the first polysilicon lines and the substrate to form a conformal silicon oxide layer over the substrate and the first polysilicon lines, anisotrophically etching the conformal silicon oxide layer to expose the top surfaces of the first polysilicon lines forming silicon oxide spacers, having vertical sidewalls, on the polysilicon line sidewalls and exposing areas of the substrate between the spacers, oxidizing the exposed top surface of the first polysilicon lines and the exposed areas of the substrate between the spacers to form a second insulating layer, depositing a second polycrystalline silicon layer having a substantially planar top surface on the substrate, and anisotrophically etching the second polycrystalline silicon layer forming second polysilicon lines.

12. The method of claim 11 wherein said first polysilicon lines have an initial width in the range of 0.4 to 0.8 microns, and an initial pitch in the range of 0.8 to 1.6 microns.

13. The method of claim 11 wherein the first polysilicon lines have a thickness in the range of 2000 to 4000 Angstroms.

14. The method of claim 11 wherein a thin conformal polycrystalline silicon layer is deposited over the first polysilicon lines and the exposed portions of the first insulating layer.

15. The method of claim 14 wherein the thin conformal polycrystalline silicon layer has a thickness in the range of 500 to 2000 Angstroms.

16. The method of claim 14 wherein the thin conformal polycrystalline silicon layer is completely oxidized to form said conformal silicon oxide layer over the substrate and the first polysilicon lines.

17. The method of claim 11 wherein the first polysilicon lines are made conductive by insitu doping.

18. The method of claim 11 wherein the said first polysilicon lines are made conductive by ion implantation.

19. The method of claim 11 wherein the silicon oxide spacers have a width in the range of 1000 to 4000 Angstroms.

20. The method of claim 11 wherein the second insulating layer has a thickness in the range of 80 to 200 Angstroms.

* * * * *